(12) United States Patent
Lo

(10) Patent No.: US 6,688,948 B2
(45) Date of Patent: Feb. 10, 2004

(54) WAFER SURFACE PROTECTION METHOD

(75) Inventor: Yung-Tsun Lo, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 148 days.

(21) Appl. No.: 09/929,472

(22) Filed: Aug. 13, 2001

(65) Prior Publication Data

US 2002/0072236 A1 Jun. 13, 2002

Related U.S. Application Data

(63) Continuation-in-part of application No. 09/393,609, filed on Sep. 10, 1999, now abandoned.

(30) Foreign Application Priority Data

Jul. 7, 1999 (TW) .......................................... 88111499 A

(51) Int. Cl.[7] .................................................. B24B 1/00
(52) U.S. Cl. ............................ 451/41; 451/54; 451/59; 451/63; 156/299; 156/289; 156/323; 438/458; 438/459
(58) Field of Search ................................ 438/690, 691, 438/692, 693, 458, 459, 694, 698, 696; 451/41, 54, 59, 63; 156/241, 247, 299, 289, 344, 323

(56) References Cited

U.S. PATENT DOCUMENTS

| | | | | |
|---|---|---|---|---|
| 3,809,050 A | * | 5/1974 | Chough et al. | 125/35 |
| 3,849,948 A | * | 11/1974 | Youmans et al. | 451/29 |
| 4,722,130 A | * | 2/1988 | Kimura et al. | 29/413 |
| 5,494,549 A | * | 2/1996 | Oki et al. | 156/268 |
| 5,851,664 A | * | 12/1998 | Bennett et al. | 428/355 BL |
| 5,891,298 A | * | 4/1999 | Kuroda et al. | 156/344 |
| 6,059,637 A | * | 5/2000 | Pasch et al. | 451/41 |
| 6,153,536 A | * | 11/2000 | Brouillette et al. | 438/758 |
| 6,503,130 B2 | * | 1/2003 | Lim | 451/285 |
| 6,551,447 B1 | * | 4/2003 | Savas et al. | 156/345.48 |

* cited by examiner

Primary Examiner—Timothy V. Eley
(74) Attorney, Agent, or Firm—J.C. Patents

(57) ABSTRACT

In a wafer surface protection method, a protective film is formed on a front surface of a wafer before the wafer performs a potentially wafer process. The protective film is a non-adhesive layer. An adhesive tape is adhered onto the protective film before conducting the polluting process. After the polluting process is completed, the adhesive tape is removed along with the protective film. As a result, no adhesive residues remain on the surface of the wafer.

12 Claims, 3 Drawing Sheets

WAFER SURFACE PROTECTION METHOD

CROSS-REFERENCE TO RELATED APPLICATION

This application is a continuation-in-part of prior applications Ser. No. 09/393,609, filed Sep. 10, 1999, which is now abandond.

BACKGROUND OF THE INVENTION

1. Field of the Invention

The present invention relates to a fabrication method of a semiconductor device. More particularly, the method relates to a wafer surface protection.

2. Description of the Related Art

In the back-end stage of the conventional wafer manufacturing process, a wafer back lapping is conducted after passing the wafer acceptance test and before the wafer is delivered to customers. The purpose of back lapping is to facilitate the wafer dicing and packaging. The back lapping procedure is a substantially polluting process, therefore, the wafer is easily contaminated.

FIG. 1 is a cross-sectional view showing the fabrication of a semiconductor device according to the prior art. Referring to FIG. 1, a wafer 100 is provided. A bonding pad 102 is formed on the wafer 100. A first passivation layer 104 is formed on the bonding pad 102 and the wafer 100. A second passivation layer 106 is further formed on the first passivation layer 104. The second passivation layer includes a polyimide layer. The second passivation layer 106 is then patterned to form an opening 108 above the bonding pad 102. Debris, for example polyimide residues 120, usually remain on the surface of bonding pad 102. The polyimide residues 120 are commonly removed by performing a descum ash process.

To prevent the wafer from being contaminated and being damaged during polluting processes such as the subsequent back lapping process, an adhesive tape is adhered onto the front surface of the wafer 100 for protection. However, adhesive residues usually remain on the wafer 100 after the adhesive tape is removed after the back lapping process is completed. The adhesive residues remaining on the wafer surface also cause a defective pad bonding and may generate other problems during packaging processes.

Although eliminating the step of the descum ash process before the back lapping process may reduce the adhesive residues, the descum ash process is however essential in the removal of the polyimide residues 120, which also cause the pad bonding problems.

SUMMARY OF THE INVENTION

Accordingly, this invention provides a method for protecting a wafer from debris remaining on the surface after a polluting process is completed. The wafer comprises a front surface and a rear surface, wherein a process that is conducted on the rear surface of the wafer may induce contamination of the front surface of the wafer. A non-adhesive protective film is therefore formed to cover the front surface of the wafer. An adhesive tape is further adhered to the protective film. After the process which may cause contamination of the wafer surface is completed, the adhesive tape along with the protective film is removed. The process that induces contamination of the wafer surface includes chemical mechanical polishing on the rear surface of the wafer.

The non-adhesive protective film, including polyethylene (PE) or polyvinyl chloride (PVC) for example, is formed by spraying a liquid protective film on the front surface of the wafer. The protective liquid film then solidifies to a solid and non-adhesive film after exposure to air. To ensure uniform distribution, the wafer rotates while spraying the liquid protective film. The duration of air exposure is about 3 to 5 minutes.

The wafer surface protection method according to the present invention is simple, in which the non-adhesive protective film can be removed along with the adhesive tape. The problem of debris such as conventional adhesive residues remaining on the surface of the wafer, which cause a defective pad bonding, is prevented.

Furthermore, according to the present invention, a descum ash process an be further performed before the application of the protective film to remove polyimide residues, because polyimide residues also cause a defective pad bonding.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A to 2E are schematic, cross-sectional views showing the method for protecting the surface of a semiconductor wafer according to the present invention.

Figure 1:
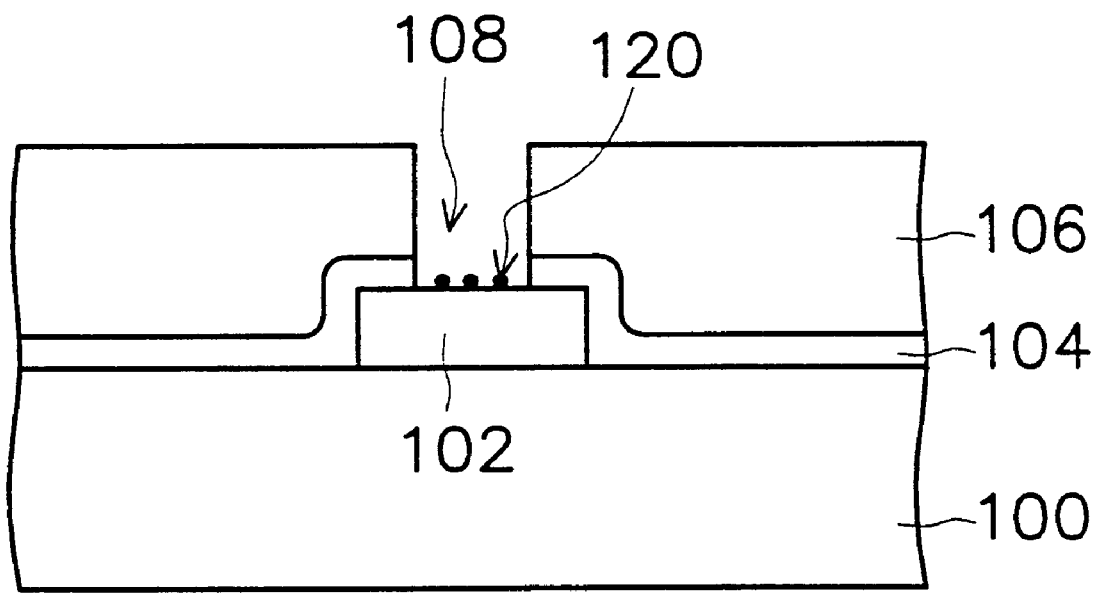
FIG. 1 is a cross-sectional view showing the fabrication of a semiconductor device according to the prior art.
Figure 2A:
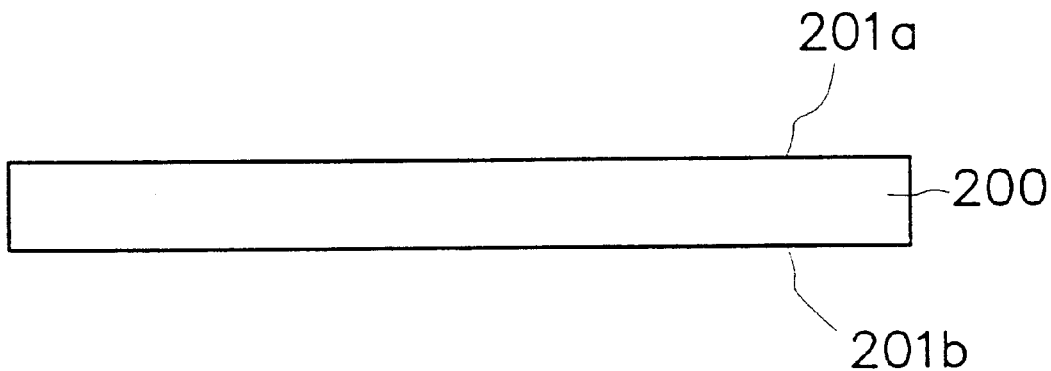
FIGS. 2A to 2E are cross-sectional views showing the method for protecting the surface of a semiconductor wafer according to the present invention.

Referring to FIG. 2A, a wafer 200 has a front surface 201a and a rear surface 201b. Various types of semiconductor devices including various materials such as polyimide or metals that form passivation layers and contact pad, for example, may be formed on the front side 210a of the wafer 200. For the sake of simplification, the semiconductor devices are not illustrated in the figures.

Figure 2B:
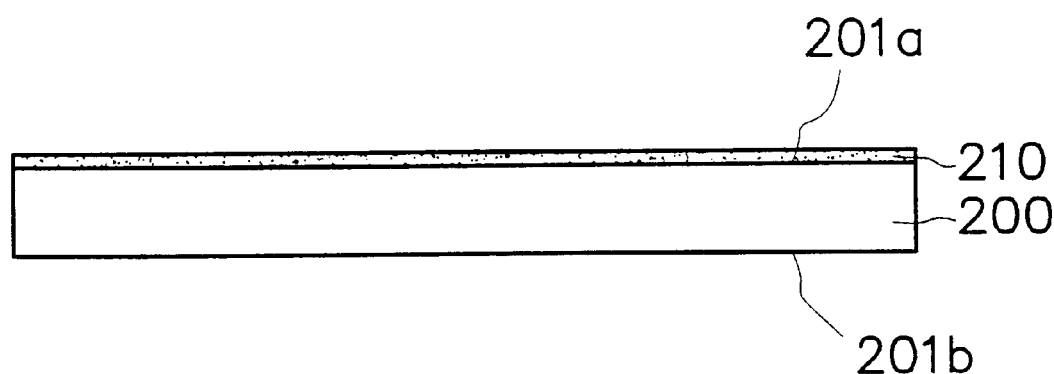

Referring to FIG. 2B, a protective film 210 is formed on the front surface 201a of the wafer 200. The protective film 210 must be non-adhesive to avoid conventional adhesive residues remaining on the front surface of the wafer after the protective film is removed. The protective film 210 is initially liquid formed on the wafer 200, therefore it can be evenly distributed on the wafer 200 surface. After an exposure to air, the liquid protective film 210 solidifies to form a solid and non-adhesive protective film 210 on the wafer surface. The protective film 210 includes polyethylene (PE), polyvinyl chloride (PVC), or other type of materials comprising the above-mentioned characteristic.

The protective film 210 is formed by, for example, spraying and solidification processes. The spraying process includes spraying a thin layer of the liquid protective film. The liquid protective film is sprayed from above a rotating wafer 200 to ensure uniformity. The solidification process includes an exposure of the wafer 200 to air for 3 to 5 minutes, and transforming the liquid protective film into a solid film after an exposure to air. Before the protective film is formed, a descum ash process may be performed to remove residues resulted from previous wafer processing steps performed to form semiconductor devices thereon. Residues can be, for example, polyimide residues.

Figure 2C:
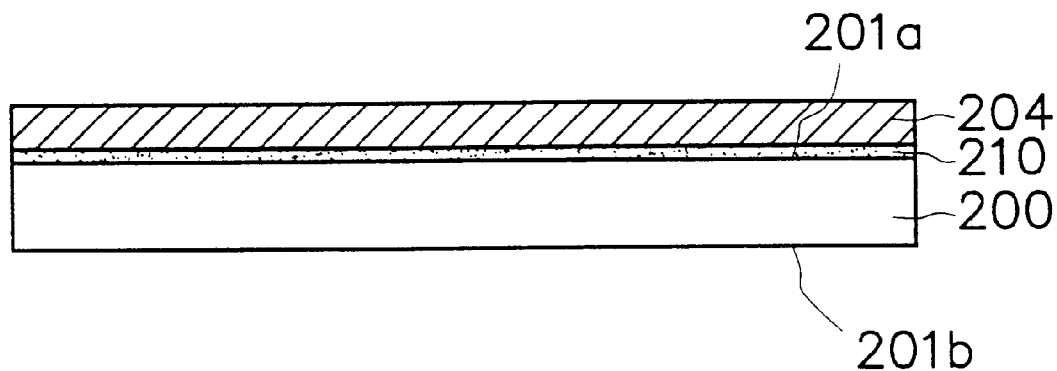

Referring to FIG. 2C, an adhesive tape 204 is adhered onto the protective film 210.

Figure 2D:
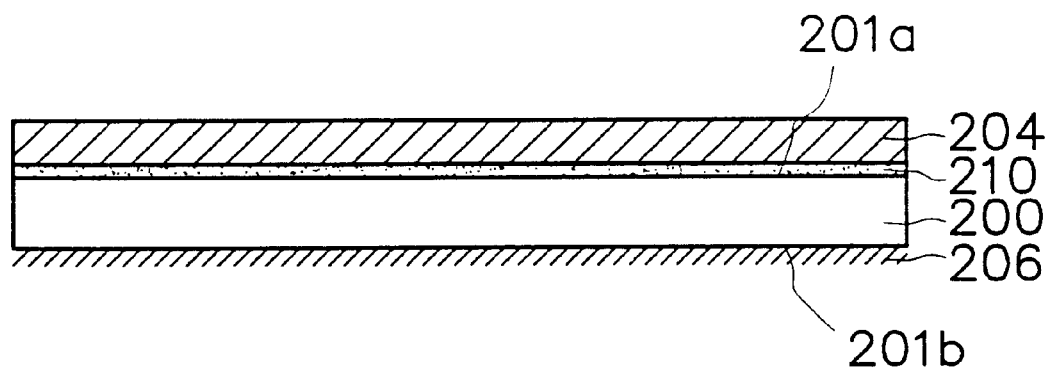

As shown in FIG. 2D, a wafer back lapping 206, such as chemical mechanical polishing, is conducted on the rear side 201b of the wafer 200.

Figure 2E:
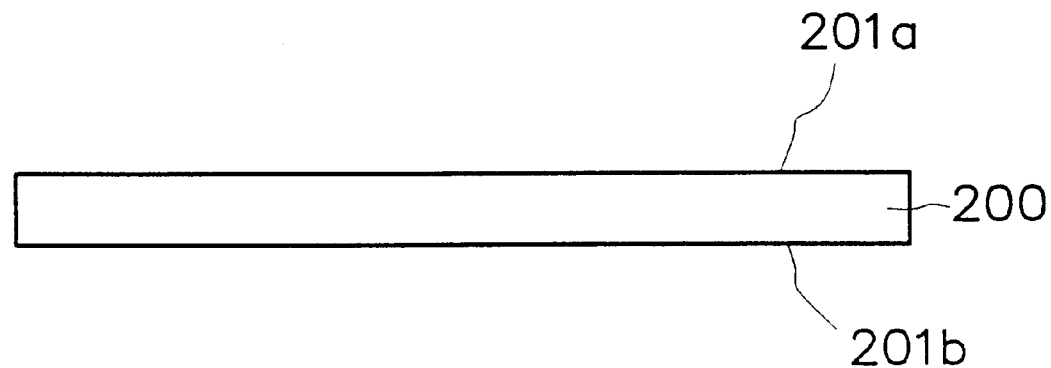

Referring to FIG. 2E, the adhesive tape 204 is peeled off. The solid protective film 210 on the wafer 200 surface is removed along with the adhesive tape 204. As a result, no adhesive debris remain on the wafer 200 surface.

The protective film 210 preferably is not a photoresist because the process for forming a photoresist is complicated. The photolithography process includes a baking process which can damage the bonding pad easily. Furthermore, after the adhesive tape is peeled off, a developer is required to remove the photoresist. Since the photoresist developer is a basic solution, it causes erosion and damages the metallic pad surface.

The present invention comprises the following characteristics. The procedure for protecting the wafer surface according to the present invention is simple. A protective film is formed on the wafer surface before potentially polluting wafer processes are performed. The protective film must be non-adhesive. An adhesive tape is formed on the protective film. As a result, adhesive debris remaining on the wafer surface after removal of the non-adhesive protective film are prevented. After the wafer processes are completed, the protective film is removed along with the adhesive tape. The wafer surface and the pad surface thus are protected. The protective film of the present invention thus prevents the problem of forming adhesive residues. A descum ash process may be also performed before applying the protective film to remove debris, such as polyimide residues, resulted from previous processing steps without compromising the efficiency of the adhesive residues removal.

It is to be understood that both the foregoing general description and the following detailed description are exemplary, and are intended to provide further explanation of the invention as claimed.

What is claimed is:

1. A wafer surface protection method, wherein the wafer comprises a front surface and a rear surface, and the rear surface is to be treated in a process which will be performed after the wafer surface protection method and may also cause contamination to the front surface, the wafer surface protection method comprising the steps of:

forming a non-adhesive protective film directly on the front surface of the wafer;

forming an adhesive tape on the non-adhesive protective film; and removing the adhesive tape along with the non-adhesive protective film after the process that may cause contamination has been achieved, wherein the non-adhesive protective film, when removed from the front surface, leaves no residues on the front surface of the wafer.

2. The wafer surface protection method according to claim 1, wherein the non-adhesive protective film includes polyethylene.

3. The wafer surface protection method according to claim 1, wherein the non-adhesive protective film includes polyvinyl chloride.

4. The wafer surface protection method according to claim 1, wherein the non-adhesive protective film is formed by a method including:

spraying a liquid protective film on the front surface of the wafer; and forming a solid and non-adhesive protective film by exposing the liquid protective film to air.

5. The wafer surface protection method according to claim 4, wherein the exposure to air is about 3 to 5 minutes.

6. The wafer surface protection method according to claim 4, wherein the wafer is rotated during the spraying of the liquid protective film.

7. A wafer surface protection method comprising:

providing a wafer comprising a front surface and a rear surface;

performing a descum ash process;

spraying a liquid film on the front surface of the wafer;

exposing the liquid film to air to form a solid and non-adhesive film;

adhering an adhesive tape onto the solid and non-adhesive film;

performing a wafer back lapping on the wafer; and removing the adhesive tape adhered with the solid and non-adhesive film.

8. The wafer surface protection method according to claim 7, wherein the descum ash process removes debris resulted from previous processes.

9. The wafer surface protection method according to claim 7, wherein the solid and non-adhesive film includes polyethylene.

10. The wafer surface protection method according to claim 7, wherein the solid and non-adhesive film includes polyvinyl chloride.

11. The wafer surface protection method according to claim 7, wherein the wafer rotates during the spraying of the liquid film.

12. The wafer surface protection method according to claim 7, wherein the back lapping process includes chemical mechanical polishing.

* * * * *